United States Patent [19]

Winters

[11] 4,114,111
[45] Sep. 12, 1978

[54] CONSTANT PHASE DELAY NETWORK HAVING A COHERENT REFERENCE

[76] Inventor: Paul N. Winters, P.O. Box 327, Trumann, Ark. 72472

[21] Appl. No.: 799,445

[22] Filed: May 23, 1977

[51] Int. Cl.² .......................... H03B 3/04; H04B 3/36
[52] U.S. Cl. ..................................... 331/23; 178/70 T;
   179/170 R; 328/155; 331/25
[58] Field of Search ............................. 331/18, 23, 25;
   328/155; 179/170 R, 170 HF; 178/70 R, 70 T

[56] References Cited

U.S. PATENT DOCUMENTS 3,805,173 4/1974 Nakamura et al. .................. 328/155
3,992,581 11/1976 Davis ................................. 178/70 R Primary Examiner—Siegfried H. Grimm

[57] ABSTRACT

The delay elements of a signal energy transmission network are divided into separate portions through which the transmitted energy is phase shifted by substantially equal amounts. A phase correction circuit reverses the phase shift through one of the divided delay portions by providing a locked oscillator operating at twice the frequency of the signal at a reference phase angle and subtracting therefrom the input frequency of the signal phase shifted through said one of the divided delay portions in order to maintain a constant frequency vs. phase relationship.

10 Claims, 4 Drawing Figures

CONSTANT PHASE DELAY NETWORK HAVING A COHERENT REFERENCE

BACKGROUND OF THE INVENTION

This invention relates to the combination of coherent amplification of signals through energy transmission networks having delay elements therein, wherein the phase between the input and output are automatically corrected to be the same phase. Therefore, this invention can be used to enhance or improve the reception of modulated signals such as those used in radio transmission and reception, under marginal conditions of interference. This invention would normally be used in the intermediate stages of the signal receiver, but is not restricted to such usage. The intermediated stages of a signal receiver usually contain tuning, bandpass and/or filtering elements having phase shift and corresponding delay characteristics and amplitude characteristics associated with the said receiving elements. According to the embodiments of this invention, the delay and amplitude characteristics are retained and the phase characteristics are modified as hereinbefore stated.

It is therefore an important object of the present invention to provide a technique for eliminating phase shift between terminals of an energy transmission network having a coherent reference frequency.

Another object of the present invention is to provide a method for reducing signal interference by the use of a coherent reference signal.

Another object of the present invention is to provide a method for locking a coherent reference signal to the incoming signal without producing an audible heterodyne.

Another object of the present invention is to provide a method for reducing interference from interfering stations operating in the same frequency band.

Another object of the present invention is to provide a method for coherently integrating a modulated signal wherein the output signal is at the same center frequency as the input signal.

Another object of the present invention is to provide a method for automatically locking to an incoming signal with coherent amplification means in order to simplify the tuning of a receiver.

This invention is related to an invention titled "Electrical Energy Transmission Network", Inventor Paul N. Winters, 115 N. Crest, Trumann, Arkansas, Ser. No. 787,373 filed Apr. 14, 1977 and now U.S. Pat. No. 4,095,185.

SUMMARY OF THE INVENTION

In accordance with the present invention an energy transmission network having energy storing delay elements or tuning elements therein through which a sinusoidally varying electrical current is transmitted, is modified so as to divide the delay elements or tuning elements into separate portions through which phase shift occurs by equal amounts over a given frequency range. The separate delay portions are connected in series with a frequency subtracting modulator between the input and output terminals of the network so as to effect sequential phase shift while performing the delay or tuning function. The modulator forms part of a phase correcting circuit which is operative to reverse the phase shift produced by one of the separate delay portions in order to cancel the phase shift of the other delay portion. This phase shift reversal is accomplished by providing a locked oscillator operating at twice the incoming frequency at a reference phase angle, and subtracting therefrom the signal at the input frequency after phase shift through said one of the delay portions. The transmission network so modified becomes a constant-phase delay circuit at the signal frequency which behaves differently from ordinary delay circuits when utilized in combination with other components to perform integration operations for example.

These, together with other objects and advantages which will subsequently become apparent, reside in the details of construction and operation as more fully hereinafter described and claimed, reference being had to the accompanying drawings forming a part hereof, wherein like numerals refer to like parts throughout.

DETAILED DESCRIPTION OF PREFERRED EMBODIMENTS

Figure 1:
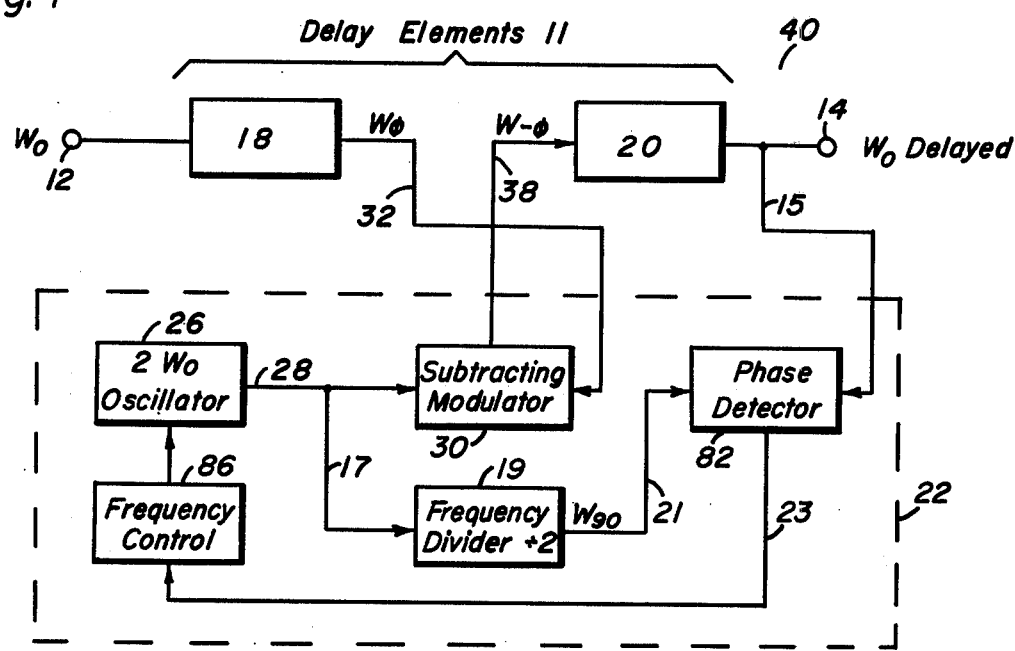
FIG. 1 is a schematic block diagram showing a constant-phase delay network having a coherent reference in accordance with the present invention.
Figure 2:
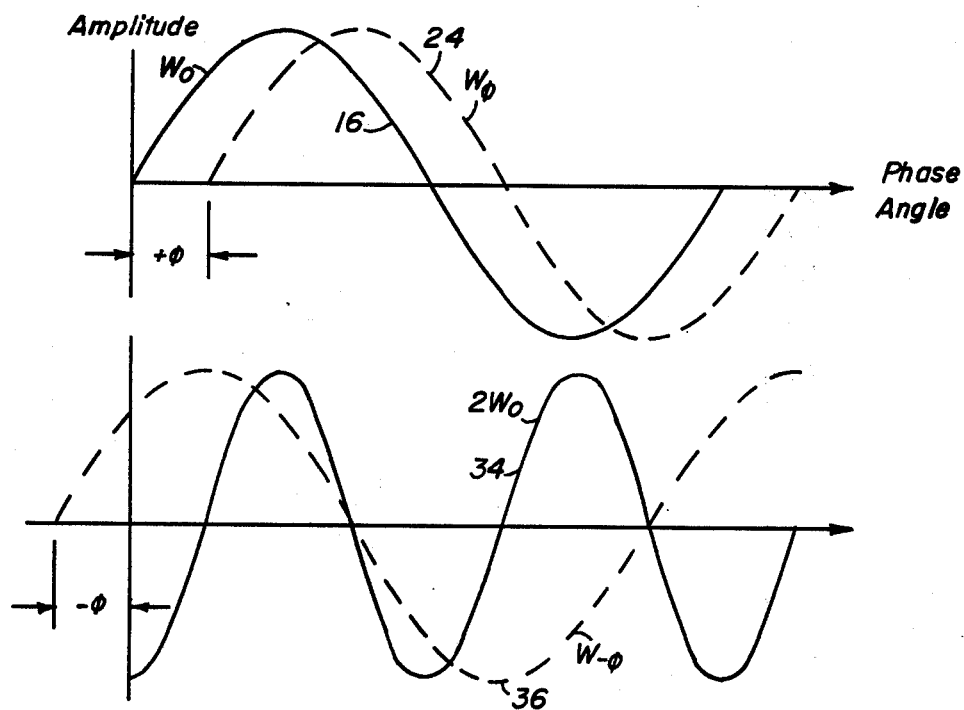
FIG. 2 is a graphical illustration showing certain waveforms associated with the network shown in FIG. 1.

Referring to the drawings in detail, FIG. 1 diagrammatically illustrates a constant-phase delay network having a coherent reference generally referred to by reference numeral 40 arranged in accordance with the present invention. Electrical energy in the form of a modulated carrier is applied to input terminal 12 of the network. A time delayed output signal is obtained at the output terminal 14 with a net change in phase substantially equal to zero. FIG. 2 shows, by way of example only, the sinusoidal input signal denoted by reference numeral 16 having a frequency index W and a reference phase angle of zero appearing as a subscript to the signal frequency designation W. In accordance with the present invention, the delay elements 11 associated with the transmission network is divided into two portions 18 and 20 as shown in FIG. 1 interconnected in series by a phase correcting circuit generally referred to by reference numeral 22. The divided portions 18 and 20 will accordingly produce a signal delay ordinarily associated with energy storing delay or tuning elements prior to being divided into separate portions without, however any net change in phase of the transmitted energy. Each divided portion 18 and 20 will itself produce a change in phase in the same direction denoted by $\phi$ as indicated in FIG. 2 with respect to the phase shifted, sinusoidal signal 24. In the embodiment illustrated in FIG. 1, both divided portions 18 and 20 of the delay elements phase shift the signal by equal amounts $\phi$ for what is ordinarily a total phase shift of $2\phi$.

The phase correcting circuit 22 includes an oscillator 26 which operates at a frequency 2 W which is twice the input frequency W. This oscillator signal is fed through line 28 to one input of a single-side-band type of frequency subtracting modulator 30. The phase shifted ouput of the divided delay portion 18 is fed through line 32 to the other input of the modulator 30 in order to subtract the input frequency of the phase shifted signal from the oscillator signal and thereby reverse the phase shift of the divided delay portion 18. Thus, as shown in FIG. 2, the oscillator signal component 34 is operative through the subtracting modulator 30 to produce a frequency component signal 36 that is phase shifted in a reverse direction by an amount $-\phi$ which appears in the output line 38 of the modulator as depicted in FIG. 1. The output of the modulator 30 is fed through line 38 to the other divided delay portion 20 of the network in which it is again phase shifted so as to produce a net change in phase equal to zero at the output terminal 14.

With continued reference to the arrangement depicted in FIG. 1, a phase detector 82 is operative to produce an error signal at output line 23 to a frequency control 86. The frequency control 86 is operative to cause the oscillator 26 to lock at twice the frequency $W_o$. The oscillator 26 frequency is fed through line 17 to a frequency divider 19 which is adjusted to produce a frequency W at an angle of 90° with respect to $W_o$. This signal is fed through line 21 to one input of the said phase detector 82. The output signal W is fed through line 15 to the other input of the said phase detector 82. When the frequency and phase of oscillator 26 are correct, the output of the said phase detector 82 will stabilize at a constant value sufficient to hold the frequency and phase of the oscillator 26 at the correct value.

Figure 3:
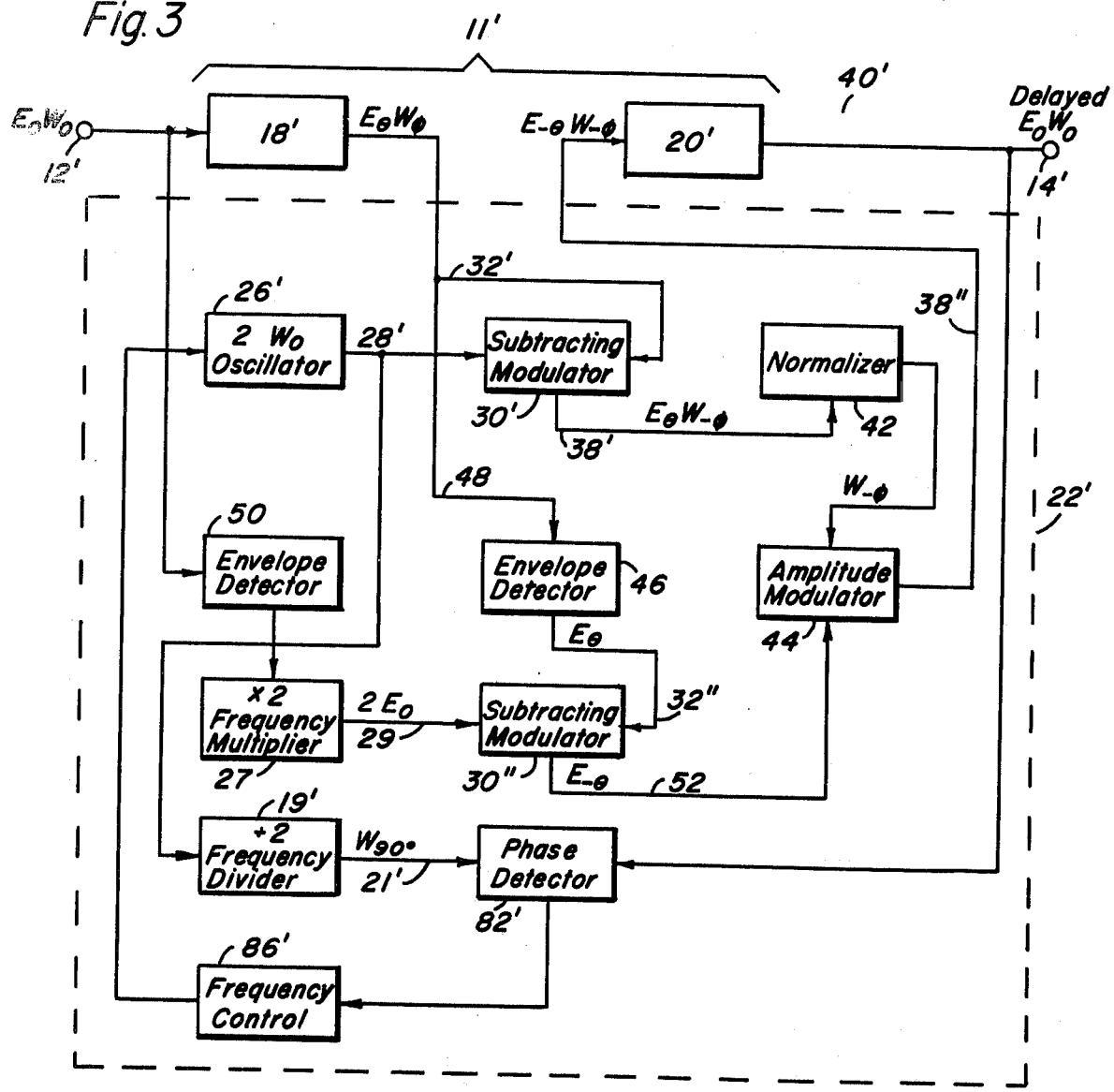
FIG. 3 is a schematic block diagram of a constant phase delay network having a coherent reference with signal envelope phase correcting capabilities.

FIG. 3 illustrates another energy transmission network generally referred to by reference numeral 40' in which the delay elements 11' of the network are again divided into separate portions 18' and 20' between input terminal 12' and output terminal 14'. A phase correcting circuit 22' with which the network is associated, is designed to handle energy in another class such as complex amplitude modulation components associated with the signal carrier. The complex amplitude modulation components include but are not limited to such signals as speech and music. Such signals appear as variations in the amplitude of the received carrier in amplitude modulated systems. The signal received is assumed to be composed of the instantaneous carrier W and the envelope component E. Thus, the circuit 22' not only maintains a constant phase with respect to the instantaneous frequency W but also with respect to the envelope component E. The phase correcting circuit 22', as in the case of the circuit 22 depicted in FIG. 1, includes an oscillator 26' which operates at a frequency 2W which is twice the input frequency W, and having an output line 28' connected to one input of a frequency subtracting modulator 30', the other input of which is connected through line 32' to the output of the first divided delay portion 18' of the delay elements. The output of the subtracting modulator 30' is connected through line 38' to a normalizer component 42 which removes amplitude variations and feeds the transmitted energy to amplitude modulator 44. The other input to the modulator 44 is connected to the output of a second subtracting modulator 30". A doubled frequency component is fed to one input of the modulator 30" through line 29 from a frequency multiplier 27. The other input of the modulator 30" receives a signal through line 32" from the output of an envelope detector 46 connected by line 48 to the output of the delay portion 18'. Another envelope detector 50 is connected to the input terminal 12' to supply an input signal to the frequency multiplier 27. It will be apparent, therefore, that the instantaneous input frequency at the reference phase angle ($W_o$) will be fed to the subtracting modulator 30' where it will be subtracted from the oscillator signal $2W_o$ in order to produce a reverse phase shifted frequency $W_{-\phi}$ in its output line 38' which is fed to the modulator 44. The envelope frequency on the other hand will be detected by the detectors 50 and 46 at the input terminal 12' and in line 48 respectively. The detector 50, accordingly, will supply the envelope frequency at the reference phase angle ($E_o$) to the frequency multiplier 27, for supply of a double frequency component of the envelope to the subtracting modulator 30" while the detector 46 will supply the phase shifted envelope frequency component $E_\theta$ to the other input of the modulator 30" in order to produce at the output of the modulator a reverse phase shifted envelope frequency component $E_{-\theta}$. The amplitude modulator 44 is connected to the output of modulator 30" through line 52 and accordingly produces an output in line 38" in which both frequency components are phase shifted in a reverse direction. The output line 38" of the modulator 44 being connected to the second divided delay portion 20' will, therefore, result in an output at output terminal 14' in which there is a net change in phase equal to zero with respect to both frequency components.

Figure 4:
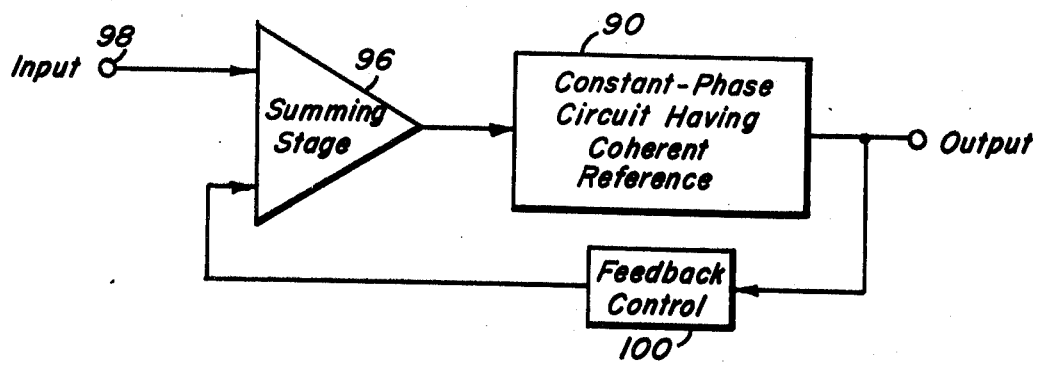
FIG. 4 is a block diagram of a constant-phase delay network having a coherent reference with integration capabilities.

The technique hereinbefore described may be used to coherently amplify signals in any system with which the various described phase-correcting operations are compatible in an open loop configuration. The transmission networks hereinbefore described may also be utilized as coherent amplification circuits in which the constant-phase feature and double frequency coherent amplification cause different behavior from ordinary receiver circuits. FIG. 4 depicts, for example, a constant-phase delay network having a coherent reference frequency arranged in accordance with one of the embodiments hereinbefore described. The constant-phase circuit 90 with coherent reference has its input connected to the output of a summing device 96 to which one input is applied from input terminal 98. The output of circuit 90 is connected through a feedback control component 100 to the other input of the summing device 96 in order to perform an integration operation. In the arrangement depicted in FIG. 4, an improvement in signal-to-noise ratio will occur if the feedback factor associated with the feedback control 100 is greater than zero and less than unity. Where the summing device 96 adds the output to the input signal in phase, integration is performed with respect to the frequency and phase of a continuous-wave signal $W_o$ to which the circuit is locked. On the other hand, where the summing device adds the output and input signals in out-of-phase relationships, integration is performed with respect to phase reversed signals of the same period as the total delay of the circuit 90. The phase reversed signals may contain information in the form of amplitude modulation.

The network configurations hereinbefore described may be combined or cascaded in some applications in order to attain desired results not possible in one operation. For example, the configuration illustrated in FIG. 4 may be utilized to obtain a signal gain of 1,000 with a feedback factor of 0.999. However at certain frequencies the gain around the loop might exceed the limits hereinbefore indicated with respect to the invention, rendering the system unstable. In such a case, three networks may be cascaded to produce a more practical system, with each network having a feedback factor of 0.9 to achieve the same result.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention.

Examples of the equivalence hereinbefore referred to are:

1. Use of an oscillator operating at the signal frequency with a frequency multiplier to derive the double frequency component applied to line 28 in FIG. 1 or line 28' in FIG. 3.

2. Use of an oscillator operating at an integer multiple of the oscillator frequency with frequency dividers to obtain the double frequency component applied to line 28 in FIG. 1 and line 28' in FIG. 3 and also the frequency component applied to line 21 in FIG. 1 and line 21' in FIG. 3.

While such modifications and equivalents might be useful in certain applications of the invention as a matter of convenience or to extend the useful frequency range the objects and claims of the invention remain the same as herein stated.

What is claimed is as follows:

1. A method of maintaining a substantially constant phase relationship between transmitted energy at input and output terminals of an energy transmission network having energy storing delay elements producing a change in phase of the transmitted energy with respect to an input frequency thereof, including the steps of: dividing the energy storing delay elements into two separate portions respectively producing equal changes in phase of the transmitted energy; passing the transmitted energy from said input terminal through one of said divided delay portions to phase shift the transmitted energy; locking an oscillator at a reference phase angle to the input frequency, said oscillator operating at twice the input frequency; subtracting the input frequency of the transmitted energy passed through said one of the divided delay portions from the oscillator frequency at said reference phase angle to reverse the phase shift of the transmitted energy passed through said one of the divided delay portions, and passing the energy resulting from said subtracting step through the other of said divided delay portions to said output terminal whereby the phase shift effected by the said other of the divided delay portions produces a net change in phase substantially equal to zero.

2. The method of claim 1 wherein said transmitted energy is an electrical sinusoidal signal.

3. The method of claim 1 wherein said transmitted energy is a modulated electrical carrier signal.

4. The method of claim 1 wherein said transmitted energy is a single-sideband signal with locally inserted carrier signal.

5. The method of claim 1 wherein said transmission network further includes a feedback path from the output terminal and summing means for adding the transmitted energy at the input terminal to the energy in the feedback path to perform an integration operation, including the step of: limiting the transmission of energy through said feedback path to a feedback factor less than unity.

6. The method of claim 2 wherein said electrical signal includes an additional amplitude modulation component.

7. The method of claim 2 wherein said transmission network further includes a feedback path from the output terminal and summing means for adding the transmitted energy at the input terminal to the energy in the feedback path to perform an integration operation, including the step of: limiting the transmission of energy through said feedback path to a feedback factor less than unity.

8. In combination with an energy transmission network having energy storing delay elements between input and output terminals, means interconnecting equally divided portions of the energy storing delay elements for maintaining a substantially constant phase relationship between the transmitted energy at said input and output terminals, comprising: means for transmitting the energy through the said divided portions of the energy storing delay elements in series; oscillator means locked to twice the frequency of the said transmitted energy; modulator means connected in series between the said divided portions for subtracting the output signal of one of the said divided portions from the oscillator frequency to reverse the phase shift resulting from that portion, in order that the phase shift produced by the remaining portion of the energy storing delay elements will result in a net change in phase substantially equal to zero.

9. The combination of claim 8 including phase comparing means for adjusting the frequency and phase of said oscillator, in order to maintain said net change in phase substantially equal to zero.

10. The combination of claim 8 including integration means wherein said transmission network further includes a feedback path from the output terminal and summing means for adding the transmitted energy at the input terminal to the energy in the feedback path to perform an integration operation, including the step of: limiting transmission of energy through said feedback path to a feedback factor less than unity.

* * * * *